(12) United States Patent
Meine et al.

(10) Patent No.: US 6,624,768 B1
(45) Date of Patent: Sep. 23, 2003

(54) METHOD AND DEVICE FOR CODING/ DECODING

(75) Inventors: Nikolaus Meine, Hannover (DE); Heiko Purnhagen, Hannover (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/937,606

(22) PCT Filed: Feb. 24, 2000

(86) PCT No.: PCT/DE00/00510

§ 371 (c)(1),
(2), (4) Date: Mar. 15, 2002

(87) PCT Pub. No.: WO00/60744

PCT Pub. Date: Oct. 12, 2000

(30) Foreign Application Priority Data

Mar. 31, 1999 (DE) .......................................... 199 14 645

(51) Int. Cl.[7] .................................................. H03M 7/02
(52) U.S. Cl. .............................. 341/83; 341/50; 341/51
(58) Field of Search .............................. 341/50, 51, 83; 708/250

(56) References Cited

U.S. PATENT DOCUMENTS 3,746,847 A * 7/1973 Maritsas ..................... 708/250

OTHER PUBLICATIONS

Lampinen et al. "A New Dual–mode compressing A/D converters", Proceedings of 1997 IEEE International Symposium on Circuits and Systems, Jun. 9–12, pp. 429–432.*
Lampinen H et al: "A New Dual–Mode Data Compressing A/D Converter", IEEE International Symposium on Circuits and Systems, US, New York, NY: IEEE, Jun. 9, 1997, pp. 429–432.
Dinesh K. Anvekar et al: "A Programmable Monlinear ADC . . . ", IEEE Transactions on Instrumentation and Measurement, US IEEE Inc. New York, BD. 40, NR 6, Dec. 1, 1991, pp. 1031–1035.

Paternt Abstracts of Japan vol. 009, No. 258 (E–350), Oct. 16, 1985 & JP 60 106228 A, Jun. 11, 1985.

Dinesh K. Anvekar et al: "A Programmable Nonlinear ACD Using Optimal–Sized ROM", IEEE Transactions on Instrumentation and Measurement, US IEEE Inc. New York, vol. 40, No. 6, Dec. 1, 1991, pp. 1031–1035.

* cited by examiner

*Primary Examiner*—Jean Bruner Jeanglaude
(74) *Attorney, Agent, or Firm*—Michael J. Striker

(57) ABSTRACT

In the method for coding/decoding a target range from a value range, a recurrence step is repeated in a coding/ decoding step for the target range until code bits are found for the target range to be coded, or the target range to be decoded is found using the code bits. In the recurrence step, an interval of the value range within which the target range to be coded/decoded is located is divided into two new intervals, and a single bit is used to indicate in which of the two new intervals the target range to be coded/decoded is located. The new interval indicated with the single bit is used as the interval for the next recurrence step. The code bits for the target range to be coded or the target range to be decoded is found when the interval falls below a minimum quantity. In at least one recurrence step, a probability distribution is used as the basis for the target range in the interval, and the new intervals are selected based on the probability distribution.

11 Claims, 2 Drawing Sheets

METHOD AND DEVICE FOR CODING/DECODING

BACKGROUND OF THE INVENTION

The present invention relates to a method and an apparatus for coding/decoding using repeating recurrence steps. In each of these recurrence steps, an interval in which a value to be coded is located is divided into two new intervals, and a bit indicates in which of the new intervals formed in this manner the value is located. The method is continued until the value to be coded/decoded is located.

SUMMARY OF THE INVENTION

It is an object of the present invention to provide an improved method and apparatus of the above-described kind for coding/decoding in which the number of code bits is kept low.

In the method for coding/decoding a target range from a value range according to the invention, a recurrence step is repeated in a coding/decoding step for the target range until code bits are found for the target range to be coded, or the target range to be decoded is found using the code bits; in the recurrence step, an interval of the value range in which the target range to be coded/decoded is located is divided into two new intervals, a single bit indicates in which of the new intervals the target range to be coded/decoded is located, and the new interval indicated by the single bit is used as the interval for the next recurrence step, whereby the code bits for the target range to be coded or the target range to be decoded is found when the interval falls below a minimum quantity, wherein, in at least one recurrence step, a probability distribution for the target range in the interval is used to select the new intervals.

In the apparatus according to the invention means for performing the individual steps of the method according to the invention are provided.

The method according to the invention and the apparatus according to the invention as described above have the advantage that the number of code bits is kept low.

Preferred embodiments of the invention have additional advantages. The embodiments of the method according to the invention used to code/decode a multitude of data that have a certain sequence are particularly advantageous. When the interval limit is selected correctly, considerable savings can be achieved in terms of the number of code bits required. As a particularly simple model, probability distributions are used that depend on the number of subsequent elements in the sequence. The use of measured probability distributions has proven effective in certain applications. This applies for audio data in particular. Measured probability distributions can be stored particularly easily when they are converted to interval tables.

BRIEF DESCRIPTION OF THE DRAWING

Embodiments of the inventions are shown in the appended figures and described in greater detail in the description below.

DESCRIPTION

Figure 1:
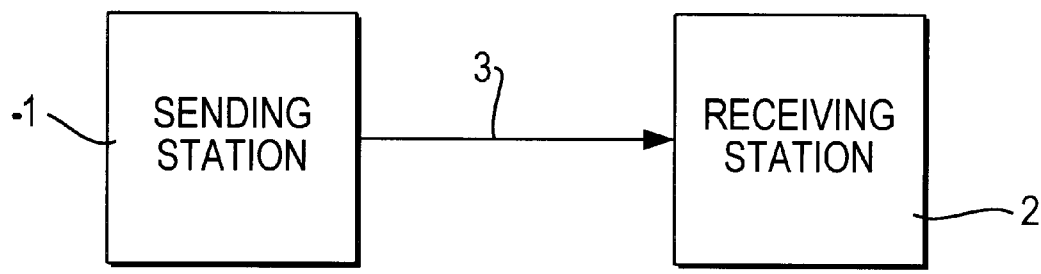
FIG. 1 is a block diagram of a sender and a receiver with a connecting transmission channel for coded data.

FIG. 1 shows a system for transmitting data having a sending station 1 and a receiving station 2, with the sending station 1 sending data to the receiving station 2 by way of a transmission channel 3. For the purpose of transmission it is necessary to code the data to be transmitted. In other words, the data to be sent are converted to digital bit signals in the sending station 1, which are then transmitted by way of the transmission channel 3. The bit sequences transmitted in this fashion are decoded in the receiving station 2. In other words, the original signals are recreated from the bit sequences received. The method described below describes how the coding of certain data is carried out with particular effectiveness, i.e., how large quantities of data are transmitted using a particularly small number of coding bits.

Figure 2:
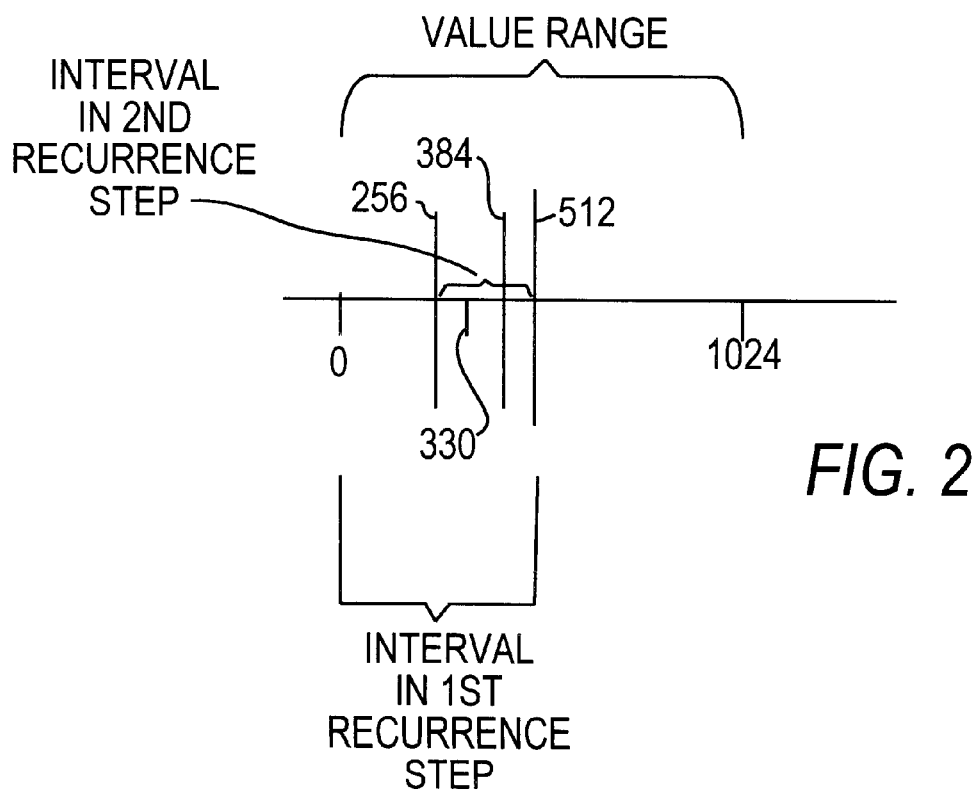
FIG. 2 is a graphical illustration of the method of coding a value by interval compartmentalization according to the invention.

The data to be coded are depicted in FIG. 2 using the stream of numbers that represents a range of values from 0 to 1023 (=$2^{10}$–1). The information or data to be coded is comprised in that individual numbers are selected out of the value range from 0 to 1023 shown in FIG. 2. This is illustrated in FIG. 2 using the number 330. The information, i.e., the individual data to be transmitted from the sending station 1 to the receiving station 2, therefore comprises the selection of the number 330 from the quantity of numbers from 0 to 1023.

The manner in which the value 330 is located using interval compartmentalization is illustrated in FIG. 2 as an example. In a first step, which is referred to below as the recurrence step, the maximum possible interval (in the first step=interval 0–1023) is divided into two new subintervals. As the starting interval, the entire value range, i.e., the numbers between 0 and 1023, are subdivided into two subintervals by specifying the interval limit 512, with the first interval extending from 0 to 511, and the second subinterval extending from 512 to 1,023. Using a single bit, the interval in which the number 330 to be coded in this case is then located. For example, a 0 can always be used to show that the number to be coded is located in the lower interval, and a 1 can be used to show that the number to be coded is located in the upper subinterval. In the present example, the first code bit would therefore be 0, because the number to be coded, 330, is located in the lower interval, i.e., the interval from 0 to 511. In a second step, the previously-defined interval is divided further into subintervals. This is carried out using the interval limit 256. A single bit is used to indicate whether the number to be coded, 330, is located in the lower interval, i.e., between 0 and 255, or in the upper interval, i.e., between 256 and 511. In the present case, the code bit is 1, because the number to be coded, 330, is located in the upper interval. In a further step, this interval is now further divided into two new intervals, with the lower interval extending from 256 to 384, and the upper interval extending from 384 to 512. The code bit 0 then indicates that the number to be coded, 330, is located in the lower interval. This method is continued until the remaining interval width comprises just one number, i.e., the number 330.

Decoding is carried out in similar a fashion, in which the receiving station 2 also carries out interval compartmentalization using the bit sequences received, until the number coded in this fashion, 330, was located in the interval between 0 and 1023.

As one can easily determine, this method, which is based on the halving of the interval under consideration into two new intervals of equal size, always requires 10 bits to select or code a number in the interval between 0 and 1023. Compared with a direct use of the dual system to transmit the number, therefore, the exact same number of bits is used. This changes, however, when the interval limits are not defined by always halving the interval as in this case, but rather when other interval limits are selected for the interval compartmentalization based on a probability distribution. For example, if the numbers to be coded have a greater probability of lying close to the value 0 than to the value 1023, the number of bits required can be reduced by wisely selecting the interval limits when compartmentalizing the intervals. For instance, if the numbers to be transmitted lie in the interval of 0 to 63 with a probability of 0.5, and they lie in the interval of 64 to 1023 with the remaining probability of 0.5, the coding requirement can be reduced in the statistical mean, because the lower interval range of 0 to 64 and the upper interval range of 64 to 1024 is sufficient for the first interval compartmentalization. If the first code bit is a 0, then, it is clear that the value to be coded is located in the interval of 0 to 63, and the value to be transmitted can be coded using 6 more bits. By using a probability distribution for the values to be coded or decoded in the compartmentalization of intervals, therefore, the number of bits required for coding can be reduced.

A further advantage arises in the transmission of a quantity of multiple numbers. When multiple numbers from the interval 0 to 1023 are to be transmitted, i.e., coded and then decoded, the number of code bits required can be reduced by sorting the data. It is essential that the numbers be transmitted, i.e., coded and decoded, in the sequence in which they form a descending or ascending series. If, after coding the number 330, it becomes clear that the subsequent number is larger or smaller, the interval required for interval compartmentalization can be reduced accordingly. The description below is based on the fact that the number 450 is to be transmitted as well, and that the sender 1 (the coder) and the receiver 2 (the decoder) know that two numbers are transmitted, and that the first number to be transmitted is the smaller one. In terms of coding as well as decoding, therefore, only the interval from 330 to 1023 needs to be considered.

Since this interval is smaller than the interval from 0 to 1023, it is possible that fewer bits will be used. The number of bits needed for coding can therefore be reduced if, when a multitude of numbers are to be transmitted (i.e., coded/decoded), they are transmitted in a sequence, and this is known by the sender and the receiver. If the smaller number is 960, for example, only 64 numbers remain in the remainder of the interval. These 64 numbers can be coded easily using 6 bits, of course. The number of bits required can therefore be reduced by transmitting multiple numbers in a certain sequence. It has also been demonstrated that, with this stipulation, none of the interval limits for compartmentalizing the intervals should consist of halving the remainder of the interval.

Figure 3:
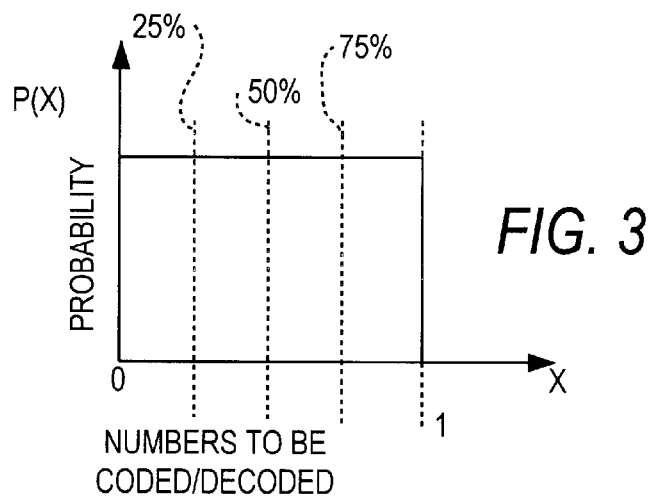
FIGS. 3 through 5 are respective graphical illustrations of different probability distributions used for selection of new intervals in the interval compartment-alization method according to the invention.
Figure 4:
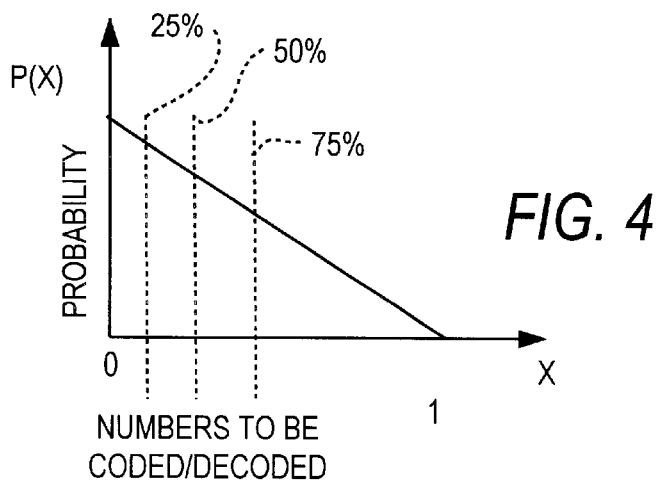
Figure 5:
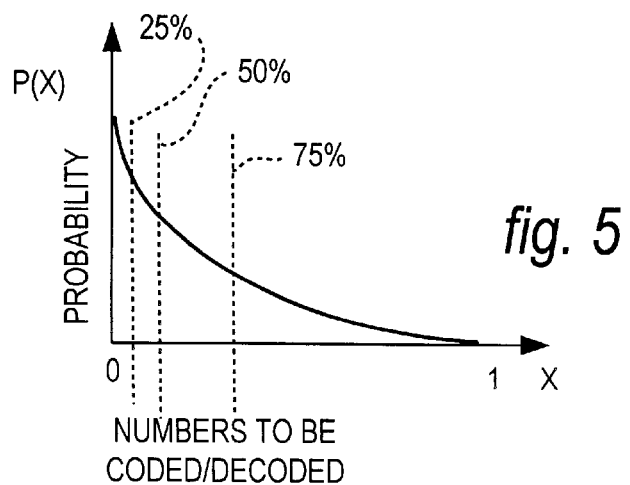

Various probability distributions that arise from theoretical considerations are illustrated in FIGS. 3, 4, and 5. It has been proven in practice that these probability distributions for real data and, in particular, for real audio data, to be coded are excellent approximations.

The probability distribution P(x) compared with a normal interval of x that extends from 0 to 1 is shown in FIGS. 3, 4 and 5. For a concrete application, this normal interval must be converted in every case to the concrete number range in which the numbers to be coded/decoded are located. As one can see in FIGS. 3 through 5, the distribution of the numbers in an interval depends on how many numbers in all are contained in the interval. This is particularly important when a multitude of numbers is coded/decoded. If 10 numbers from one value range are to be coded/decoded, for example, a different probability function should be used as the basis than if only a single number is to be coded/decoded. For the successive coding/decoding of numbers, this means that another probability distribution must be used for each coding/decoding step. To this end, the total quantity of numbers to be coded or decoded must be known during coding and decoding. The probability distributions shown in FIGS. 3 through 5 then arise, provided that an even distribution of the numbers across the entire possible value range is assumed.

The probability distribution P(x) is shown in FIG. 3 as it appears when a single value is coded/decoded. As one can easily see, the probability distribution is constant across the entire standardized value range from 0 to 1. In this case, the suitable interval limits are achieved by always dividing in the middle. In FIG. 3, the meaningful interval limits are indicated by vertical lines, each of which is labeled with a percentage. The 25%-line is at x=0.25, the 50%-line is at x=0.5, and the 75%-line is at x=0.75. It is clear that a lower and an upper interval are created by the 50%-line, whereby the probability that the value to be coded/decoded lies in the lower interval is 50% and according to the probability, that it lies in the upper interval is also 50%. If it is then determined in the first dividing step that the value to be coded/decoded lies in the lower interval, the 25% limit—by means of which this new interval is also subdivided into two intervals with a 50% probability each—represents the next favorable dividing line. It also becomes clear in FIG. 3 that, assuming an even distribution, the number of bits is hardly reduced for the coding/decoding of a single value from an interval, because it corresponds exactly to the dividing method that was illustrated in FIG. 2.

FIG. 4 shows the probability distribution for a number in the normal interval from 0 to 1, provided that there is a further number to be coded/decoded, and an even, independent probability of both numbers across the entire interval of values is assumed. The numbers to be coded are thereby coded in a certain sequence, e.g., the smaller number first and then the larger number. For the coding of the first number, then, the probability is not of equal dimension across the entire value range of 0 to 1023. If the smaller number takes the value 1022, then the larger number must take the value 1023. This means nothing more than the fact that the probability of the smaller value taking the value 1022 is relatively small. Conversely, if the smaller number has the value 1, then the value range of 1 to 1023 is available for the second, i.e., larger, number. This means that the probability of the smaller number taking the value 1 is considerably greater than the probability that the smaller number has the value 1022. The course of probability for the smaller number, which is greatest at 1 and lowest at the end of the value range, at 1023, is produced in corresponding fashion. In the standardized value range of 0 to 1, this means that the probability P(x) is greatest at 0 and least at 1. For the coding/decoding of two numbers using interval compartmentalization, the probability distribution shown in FIG. 4 should therefore be used for the smaller number, and the probability distribution shown in FIG. 3 should be used for the larger number. The distribution shown in FIG. 4 can thereby be converted to the entire value range by multiplying it with the value range, and the distribution shown in FIG. 3 can be converted to the remainder of the interval—which extends from the smaller value to the upper limit of the value range—via multiplication and shifting. The interval limits should always be selected in such a fashion that the probability that a number will lie in the two new respective intervals is the same. The first interval limits are drawn in for this distribution in this case, as in FIG. 3. The 25%-line is at x=0.134, the 50%-line is at x=0.293, and the 75%-line is at x=0.500. The 50%-line is selected in the fist dividing step, and either the 25%-line or the 75%-line is selected in the second dividing step, depending on which interval the number to be coded/decoded lies in.

FIG. 4 shows the probability distribution in the normal interval from 0 to 1 for a number to be coded/decoded with the provision that there is a further number. Another prerequisite for FIG. 4 is that the numbers are coded/decoded in a sequence. With this stipulation, the limits for defining the interval limits can then be selected as indicated once more in FIG. 4 using percentages. It is essential that these interval limits not cause the interval to be halved, but rather that they be laid out asymmetrically in such a fashion that the probability that the number to be coded/decoded lies to the right or left of the interval limits is 50%, respectively.

FIG. 5 shows the probability distribution in the normal interval from 0 to 1 for a number from this normal interval with the stipulation that following the number to be coded/decoded in this fashion are two further numbers to be coded/decoded, the values of which are greater than the number for which the probability distribution shown in FIG. 5 applies. As one can see, a probability distribution arises under these stipulations for this number to be coded/decoded at which the smaller values (i.e. the values close to 0) are more likely than the values close to 1. Based on this probability distribution, interval limits—shown here as 25%, 50%, 75%—are then selected that lead to a very efficient coding of this number that requires only a few bits. The 25%-line is at x=0.0914, the 50%-line is at x=0.205 and the 75%-line is at x=0.370.

Corresponding probability distributions can be set up with the prerequisite that 4 values follow, 5 values follow, etc. It has been shown, however, that as the number of values increases, the probability distributions change only unessentially, i.e., the probability distributions change only marginally starting at a limit of approximately 10 values.

If three values from a value range are now to be transmitted, these values are sorted in ascending order according to their size, i.e., the first number in the value range is the smallest value, and the last number is the largest number. Under this stipulation, the probability distributions shown in FIGS. 3, 4, and 5 can then be used. The probability distribution shown in FIG. 5 is then used on the entire value range to code/decode the first number. After this first number is coded/decoded, the probability distribution shown in FIG. 4 is used to code/decode the second number, which is larger than the first number, of course. In doing so, however, only the interval between the smallest number and the upper limit of the value range is considered. The probability distribution shown in FIG. 4 is therefore standardized against this interval. The second number is then coded/decoded in this interval using interval compartmentalization with consideration for the probability distribution shown in FIG. 4. To code the third and largest number, then, the probability distribution shown in FIG. 3 is used on the interval, the lower limit of which is formed by the second decoded number, and the upper limit of which is formed by the upper limit of the value range. To code and decode this number, the probability distribution shown in FIG. 3 is then used, which, in the result, always means a halving of the remainder of the interval. Using this procedure, the number of bits required to code the three numbers is kept low.

Since the method is based on probability distributions, the number of bits required for the coding depends on how much the actual distribution of the numbers corresponds to these probability distributions. It is therefore not immediately clear how many bits are required to code a certain set of numbers. In a highly unlikely distribution of numbers in the value range, it is possible that more bits will be required on an isolated basis using the present method than when using simple interval compartmentalization by halving the interval. In the statistical mean, however, considerable savings can be achieved in the magnitude of bit rate reductions of 20% to 30%.

FIGS. 4 and 5 apply for numbers to be coded or decoded that are followed by larger numbers to be coded/decoded, i.e., for an ascending sorting of numbers to be coded/decoded. If a descending sorting of numbers to be coded/decoded would be used, the probability distribution would be reflected accordingly, i.e., the probability would be greatest at value 1 and lowest at value 0.

The probability distributions shown in FIGS. 3 through 5 are based on theoretical considerations of the distribution of values in a value interval. It has been demonstrated, however, that real values exhibit similar dependencies as well. The transmission of audio data will be used here as an example. Audio data is transmitted by transmitting frequencies of sinusoidal oscillations as numerical values. The evaluation of real audio data shows that the probability of a certain frequency in the entire possible value range of frequencies after sorting the frequencies in ascending or descending order depends on how many further frequencies follow in the series. These probability distributions exhibit a similar picture as do the probability distributions in FIGS. 5 and 6 considered here, i.e., in a sorting of the frequencies as a series of ascending numbers, it was shown that, depending on the number of frequencies to follow, the probabilities toward smaller frequency values were greater than toward large frequency values. By evaluating real audio data, sample probabilities were created that have proven effective in practice for coding an ascending sequence of frequency numbers, each of which represents the frequency of sinusoidal oscillations that were superimposed to reconstruct the original signals.

To use these measured probability distributions, it is not necessary to store the entire probability distribution. Rather, it is sufficient to indicate the reasonable interval limits for interval compartmentalization based on a reference interval. The interval limits for the first 5 interval compartmentalizations obtained from selected audio data are indicated below. They are series of 31 values for interval limits that subdivide the value range into 32 ranges of equal probability. The values listed are based on a value range of 1024, i.e., to be applied to a concrete value range, these numbers must be divided by 1024 and then multiplied individually by the number of values in the interval under consideration in the actual application. The division limits used to subdivide the probability distribution into 32 ranges of equal probability are as follows:

In cases with no subsequent values:

53, 87, 118, 150, 181, 212, 243, 275, 306, 337, 368, 399, 431, 462, 493, 524, 555, 587, 618, 649, 680, 711, 743, 774, 805, 836, 867, 899, 930, 961, 992.

In cases with one subsequent value:

34, 53, 71, 89, 106, 123, 141, 159, 177, 195, 214, 234, 254, 274, 296, 317, 340, 363, 387, 412, 438, 465, 494, 524, 556, 591, 629, 670, 718, 774, 847.

In cases with two subsequent values:

26, 41, 54, 66, 78, 91, 103, 116, 128, 142, 155, 169, 184, 199, 214, 231, 247, 265, 284, 303, 324, 346, 369, 394, 422, 452, 485, 524, 570, 627, 709.

In cases with three subsequent values:

23, 35, 45, 55, 65, 75, 85, 96, 106, 117, 128, 139, 151, 164, 177, 190, 204, 219, 235, 252, 270, 290, 311, 334, 360, 389, 422, 461, 508, 571, 665.

In cases with four subsequent values:

20, 30, 39, 48, 56, 64, 73, 81, 90, 99, 108, 118, 127, 138, 149, 160, 172, 185, 198, 213, 228, 245, 263, 284, 306, 332, 362, 398, 444, 507, 608.

In cases with five subsequent values:

18, 27, 35, 43, 50, 57, 65, 72, 79, 87, 95, 104, 112, 121, 131, 141, 151, 162, 174, 187, 201, 216, 233, 251, 272, 296, 324, 357, 401, 460, 558.

In cases with six subsequent values:

16, 24, 31, 38, 45, 51, 57, 64, 70, 77, 84, 91, 99, 107, 115, 123, 132, 142, 152, 163, 175, 188, 203, 219, 237, 257, 282, 311, 349, 403, 493.

In cases with seven subsequent values:

12, 19, 25, 30, 35, 41, 46, 51, 56, 62, 67, 73, 79, 85, 92, 99, 106, 114, 122, 132, 142, 153, 165, 179, 195, 213, 236, 264, 301, 355, 452.

As mentioned above, the probability distribution for very large numbers hardly differs from subsequent values, which means that the probability distribution for seven subsequent values can always be used for these cases (this applies for audio data, at the least). Moreover, it has been demonstrated for audio data that, when the first five interval compartmentalizations take place with consideration for the probability distribution, the additional savings are minimal in the further consideration of the probability distributions. For audio data it has therefore been shown to be sufficient if only the first five interval compartmentalizations take place with consideration for the probability distribution, and any remaining further interval compartmentalizations simply take place by dividing the remainder of the interval into two new sub-intervals of equal size.

The use of tables will now be explained based on the coding of the number 330, with the condition that a further number follows:

In this case, the number 330 is selected from an interval of 0 to 1023. A glance at the table shows that the first division line is to be set at 317. This means that the probability that the number to be coded lies below this limit is exactly the same as the probability that it lies above this limit. The number relevant here, 330, lies above this limit, which means the first code bit is a 1. For the remaining interval from 318 to 1023, the next division is made between the value 524, as shown in the table. The second coded bit is therefore a 0. The next division is carried out at 412 (code bit =0). This means that the coded value is now located in the interval from 318 to 412. The next division then takes place at 363 (code bit 0), i.e., the number to be coded is limited here to the interval from 318 to 363. The next division (340 from the table) limits the range of the number to be coded to a range of 318 to 340. The further coding takes place simply by halving the remainder of the interval left as a result. The division of the interval from 318 to 340 therefore takes place at the limit 329=(318+340)/2 and leads to code bit 1.

The interval from 330 to 340 that remains as a result is repeatedly divided in the middle in further recurrence steps until the remaining interval that is left only comprises the number to be coded (i.e., 330).

Using tables stored in this fashion, the reduction of bits required for coding can be achieved using very simple means. The amount of memory required for this is minimal due to the fact that only individual limits are stored, and the coding station 1 as well as the decoding station 2 do not have to make a great deal of effort available to use the method.

The method is described here using numbers that were selected from a value range. It is clear that, instead of numbers, any type of ordered data can be used that can be arranged in a sequence. Data of this type can then be converted easily into corresponding numbers in a value range, which means the method is suited for use with any type of data. Moreover, ranges can also be given instead of individual numbers, i.e., ranges of numbers can be coded easily in this fashion.

The method was always carried out here until an individual number was reliably detected. It is also possible to break off the method if the remainder of the interval is minimal and acceptable for the respective application. Since this would further reduce the number of bits required for coding, the bit rate can be adjusted in variable fashion in a very simple manner.

What is claimed is:

1. Method for coding/decoding a target range from a value range, in which a recurrence step is repeated in a coding/decoding step for the target range until code bits are found for the target range to be coded, or the target range to be decoded is found using the code bits; in the recurrence step, an interval of the value range in which the target range to be coded/decoded is located is divided into two new intervals, a single bit indicates in which of the new intervals the target range to be coded/decoded is located, and the new interval indicated by the single bit is used as the interval for the next recurrence step, whereby the code bits for the target range to be coded or the target range to be decoded is found when the interval falls below a minimum quantity, wherein, in at least one recurrence step, a probability distribution for the target range in the interval is used to select the new intervals.

2. Method according to claim 1, wherein the target range is a single number.

3. Method according to claim 1, wherein the two new intervals in each recurrence step are selected so that the target range to be coded/decoded has an equal probability of being located in each of the two new intervals.

4. Method according to claim 1, wherein multiple target ranges are to be coded/decoded, a total number of the multiple target ranges is indicated by a value quantity, and the coding/decoding step is repeated until all of the multiple target ranges designated by the value quantity are coded/decoded.

5. Method according to claim 4, wherein the multiple target ranges are individual whole numbers.

6. Method according to claim 4, wherein a sequence of the multiple target ranges to be coded/decoded is specified to determine the probability distribution, and the probability distribution of a selected one of the multiple target ranges depends on a remaining number of the multiple target ranges in the sequence.

7. Method according to claim 6, wherein the multiple target ranges to be coded/decoded form an ascending or descending series.

8. Method according to claim 6, wherein multiple probability distributions are stored, and a total number of the multiple probability distributions for a coding/decoding step depends on the remaining number of the multiple target ranges in the sequence.

9. Method according to claim 8, wherein the stored multiple probability distributions were determined from measured data values.

10. Method according to claim 8, wherein the stored multiple probability distributions were calculated.

11. Coder/decoder for coding/decoding a target range from a value range, said coder/decoder comprising means for repeating a recurrence step in a coding/decoding step for the target range until code bits are found for the target range to be coded, or until the target range to be decoded is found using the code bits; means for dividing an interval of the value range in which the target range to be coded/decoded is located into two new intervals in the recurrence step, means for indicating in which of the new intervals the target range to be coded/decoded is located with a single bit, and means for using the new interval indicated with the single bit as the interval for the next recurrence step, and means for determining when the interval falls below a minimum quantity to establish that the code bits for the target range to be coded or the target range to be decoded is found, and means for selecting the two new intervals in at least one recurrence step with a probability distribution for the target range in the interval.

* * * * *